United States Patent [19]

Nishida et al.

[11] Patent Number: 5,185,059
[45] Date of Patent: Feb. 9, 1993

[54] PROCESS FOR PRODUCING ELECTRODE PLATE STRUCTURE FOR LIQUID CRYSTAL COLOR DISPLAY DEVICE

[75] Inventors: Naoya Nishida, Hadano; Masaaki Suzuki, Yokohama; Toshifumi Yoshioka, Hiratsuka, all of Japan

[73] Assignee: Canon Kabushiki Kaisha, Tokyo, Japan

[21] Appl. No.: 728,707

[22] Filed: Jul. 11, 1991

[30] Foreign Application Priority Data

Jul. 18, 1990 [JP] Japan .................. 2-187936

[51] Int. Cl.⁵ ............... B44C 1/22; C23F 1/00
[52] U.S. Cl. .................. 156/659.1; 156/656; 156/667; 252/72; 359/66
[58] Field of Search ......... 156/628, 647, 655, 656, 156/659.1, , 667; 252/72, 73, 74; 359/66, 67, 68

[56] References Cited

U.S. PATENT DOCUMENTS 4,838,656 6/1989 Stoddard ............... 156/667 X

OTHER PUBLICATIONS

Dietrich, Thin Solid Films, vol. 122, No. 1 (1984) 19:29.

Patent Abstracts of Japan, vol. 9, No. 217 (1985) 078401.
Patent Abstracts of Japan, vol. 12, No. 317 (1988) 082405.
Patent Abstracts of Japan, vol. 10, No. 364 (1986) 160701.
Patent Abstracts of Japan, vol. 6, No. 174 (1982) 089479.

Primary Examiner—William A. Powell
Attorney, Agent, or Firm—Fitzpatrick, Cella, Harper & Scinto

[57] ABSTRACT

An electrode plate structure for a liquid crystal color display is produced by forming a color filter layer of a photosensitive polyamide resin containing a colorant dispersed therein; disposing a protective layer of a photosensitive polyamide resin on the color filter layer; forming an ITO (indium-tin-oxide) film on the protective layer, preferably at an elevated temperature of at most 270° C.; post-annealing the ITO film at a temperature of 200°–300° C. for improving the crystallinity of the ITO film suitable for etching; and selectively etching the ITO film patternwise with an etchant of hydroiodic acid or a hydroiodic acid-ferric chloride aqueous solution mixture to leave an ITO electrode pattern.

3 Claims, 2 Drawing Sheets

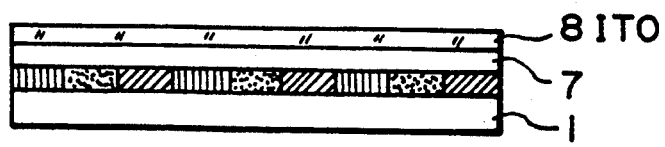
FIG. 1G
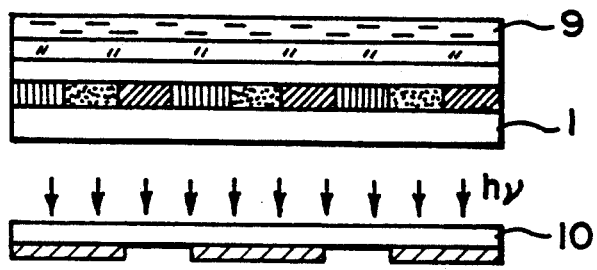
FIG. 1H
FIG. 1I
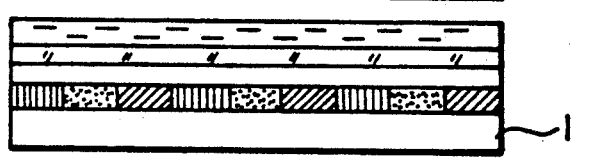
FIG. 1J
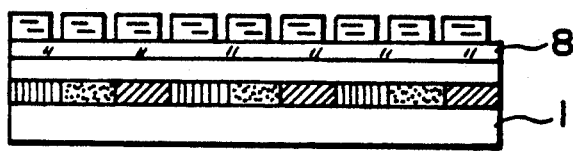
FIG. 1K
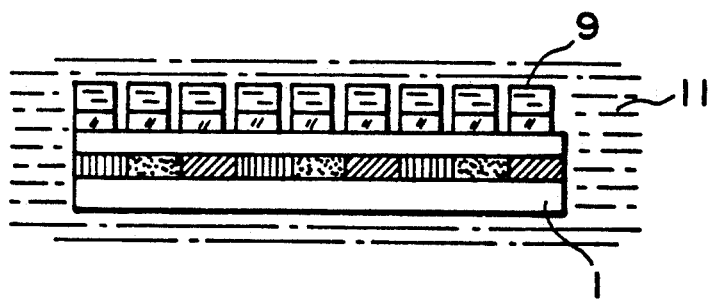
FIG. 1L
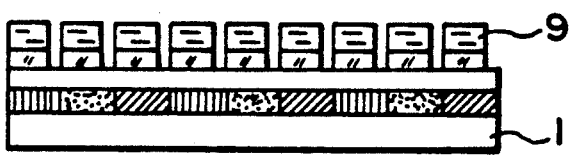
FIG. 1M
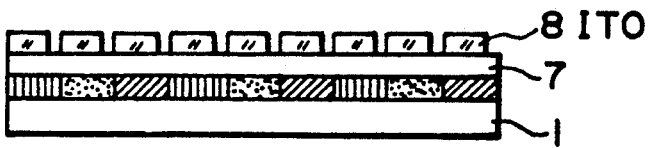

PROCESS FOR PRODUCING ELECTRODE PLATE STRUCTURE FOR LIQUID CRYSTAL COLOR DISPLAY DEVICE

FIELD OF THE INVENTION AND RELATED ART

The present invention relates to a process for producing a substrate or electrode plate structure for a liquid crystal color display device, particularly a process for producing an electrode plate structure for a liquid crystal display device having an electrode pattern of ITO (indium-tin-oxide) formed on a color filter.

As a conventional type of color filter, there has been known a dyed color filter which is obtained by coating a substrate with a dyeable layer of a hydrophilic polymer, such as gelatin, casein, glue or polyvinyl alcohol, and dyeing the layer with a colorant to form a colored layer.

Such a color filter obtained through a dyeing process encounters a difficulty when it is subjected to a heat treatment as by formation of a transport conductor film of ITO, etc., thereon, because the colorant used in the dyeing has a relatively low heat resistance on the order of 150° C.

In the case of forming a layer of ITO, etc., on a color filter, it has been a usual practice to form such a layer at a low temperature in consideration of the insufficient heat resistance of the color filter. If the formation of an ITO film is effected at a low temperature, however, the crystalline structure of the ITO is not specified, thus requiring a long time for etching thereof when an ordinary etching liquid for ITO, such as a hydrochloric acid-ferric chloride mixture, or a hydrochloric acid-nitric acid mixture. As a result, it is extremely difficult to control the shape of an ITO electrode pattern and also the color filter layer formed below the ITO can be damaged due to such a long time of etching. These difficulties have provided a serious obstacle to practical utilization a dyed color filter for a liquid crystal device.

SUMMARY OF THE INVENTION

An object of the present invention is to solve the problems accompanying the conventional process, i.e., poor heat resistance of a color filter, low-temperature formation of an ITO film required thereby and corresponding difficulty in etching thereof.

Another object of the present invention is to provide a substrate or electrode plate structure for a liquid crystal color display device wherein a heat-resistant color filter is patterned in a simple step and an ITO film formed at a low temperature is then post-treated to have a good etching characteristic.

A further object of the present invention is to provide an electrode plate structure for a liquid crystal color display device wherein an ITO electrode pattern is formed on a color filter through etching without damaging the color filter.

According to the present invention, there is provided a process for producing an electrode plate structure for a liquid crystal color display, comprising the steps of:

forming on a substrate a color filter layer comprising a photosensitive polyamide resin containing a colorant dispersed therein, coating the color filter layer with a protective layer comprising a photosensitive polyamide resin, coating the protective layer with an ITO (indium-tin-oxide) film, heat-treating the ITO film, and selectively etching the ITO film patternwise with an etchant comprising hydroiodic acid or a hydroiodic acid-ferric chloride aqueous solution mixture to leave an ITO electrode pattern.

According to the present invention, it is possible to form a well-controlled ITO electrode pattern which has been difficult to provide. Further, it is possible to prevent a color filter pattern of a colored photosensitive polyamide resin formed below an ITO film from being damaged during etching, thus providing a reliable electrode plate structure for a liquid crystal color display device at a high yield.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A through 1M are schematic sectional views for illustrating individual steps involved in a preferred embodiment of the process for producing an electrode plate structure for a liquid crystal color display device according to the present invention.

DESCRIPTION OF THE PREFERRED EMBODIMENTS

In the process for producing an electrode plate structure according to the present invention, first of all, a substrate of, e.g., glass or plastic, is coated with a photosensitive polyamide resin containing a colorant of a prescribed color, preferably an organic pigment.

The photosensitive polyamide resin used herein is a polyamide resin having an unsaturated photosensitive group. Preferred examples of the photosensitive polyamide resin may include polyamides having any one of the following aromatic units including an unsaturated photosensitive group in addition to amide linkages:

(1) Benzoate units as represented by

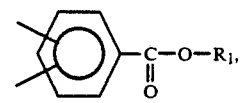

wherein
$R_1$: $CHX=CY-COO-Z-$
X: $-H, -C_6H_5$
Y: $-H, -CH_3$
Z: $-C_2H_5$ (2) Benzoate acrylate units as represented by

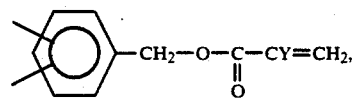

wherein
Y: $-H, -CH_3$ (3) Diphenyl ether units as represented by

Figure 1A:
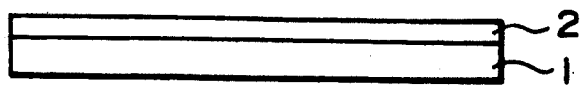
Figure 1B:
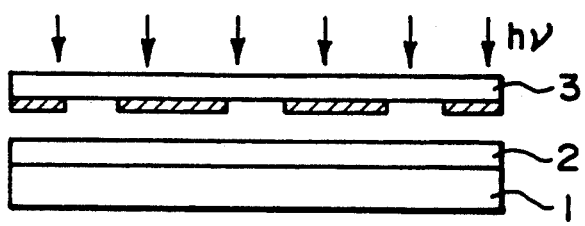
Figure 1C:
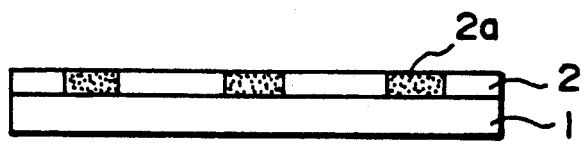
Figure 1D:

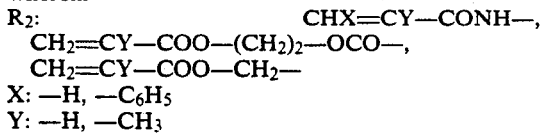

wherein
R$_2$: CHX=CY—CONH—,
CH$_2$=CY—COO—(CH$_2$)$_2$—OCO—,
CH$_2$=CY—COO—CH$_2$—
X: —H, —C$_6$H$_5$
Y: —H, —CH$_3$ Referring to FIGS. 1A to 1M for illustrating an embodiment, a solution of such a photosensitive polyamide resin in a solvent such as N-methylpyrrolidone containing further a prescribed colorant and a photopolymerization initiator as desired is applied onto a substrate 1, e.g., by spinner coating and dried to form a colored photosensitive polyamide layer 2 (FIG. 1A), which is then subjected to ordinary photolithographic steps including exposure with ultraviolet rays through a photomask 3 to form a photocured part 2a (FIGS. 1B and 1C) and developing with a solvent for removing the unexposed part to leave a color pattern 4 (FIG. 1D).

Figure 1E:
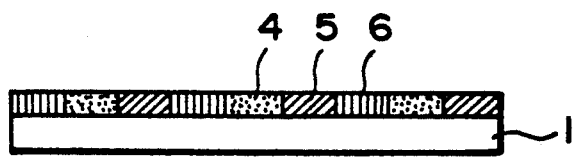

The above steps are repeated for a required number of colors, typically R (4), G (5) and B (6) to form a color filter layer in a thickness of, e.g., 1–3 microns (FIG. 1E).

Figure 1F:

Then, the thus formed color filter layer is further coated with a protective layer 7 in a thickness of, e.g., 1–3 microns (FIG. 1F). The protective layer may also suitably formed by application of a photosensitive polyamide similar to the one used for constituting the color filter but substantially free from a colorant, followed by exposure with ultraviolet rays and preferably post-curing under heating around 200° C.

Then, an ITO (indium-tin-oxide) film 8 is formed on the protective layer 7 (FIG. 1G). The ITO film may preferably be formed in a thickness of 400–2,000 Å by vapor deposition, such as sputtering. The sputtering may be performed at an elevated temperature of 270° C. or lower, preferably 250° C. or lower and preferably at least 100° C. The sputtering at such an elevated temperature on the color filter layer is possible because the color filters 4–6 are formed by a colored photosensitive polyamide having an excellent heat resistance.

The ITO film thus formed by sputtering at a relatively low temperature of at most 270° C. is present in an almost amorphous state and cannot have a sufficient crystallinity suitable for etching. Accordingly, if the ITO film is subjected to etching with an ordinary etchant, the time required for etching is fluctuated and the product quality can be remarkably lowered while requiring a quite long etching time if a complete degree of etching is desired.

In the present invention, however, the ITO film after the deposition is subjected to post annealing. Preferable conditions for the annealing may for example include: gradual heating at a rate of, e.g., 200°–300° C., preferably around 250° C.; and gradual cooling at a rate of, e.g., at most 100° C./hour, preferably at most 50° C./hour. By this annealing treatment, the crystallinity of the ITO film is improved to provide a good etching characteristic.

Then, the ITO film thus treated is subjected to patterning by ordinary lithographic steps, including formation of a photoresist 9 (FIG. 1H), pattern exposure through a photomask 10 (FIG. 1H), development of the exposed resist (FIG. 1J), etching (FIGS. 1K and 1L) and peeling of the resist to form an electrode plate structure for a liquid crystal color display device including an ITO electrode pattern corresponding to the respective color filter patterns (FIG. 1M).

In the etching step (FIG. 1K) according to the present invention, however, the ITO film is etched by using an etchant comprising hydroiodic acid or a mixture thereof with ferric chloride aqueous solution. Compared with an ordinary etchant for ITO, i.e., hydrochloric acid-ferric chloride mixture or hydrochloric acid-nitric acid mixture, the hydroiodic acid or hydroiodic acid-ferric chloride mixture can easily control the ITO electrode pattern and prevent any deterioration of the color filter layer comprising the colored photosensitive polyamide resin below the ITO film, thus allowing the production of an ITO electrode pattern having a good shape accuracy at a high yield.

In the hydroiodic acid etchant, the hydrogen iodide may preferably be contained at a concentration of 55–58 wt. %. Further, the hydroiodic acid-ferric chloride aqueous solution mixture etchant may preferably be formed by mixing a hydroiodic acid solution (55–58 wt. %) and a ferric chloride aqueous solution at a ratio of 2:1 to 3:1.

On the thus-prepared electrode plate structure according to the present invention as shown in FIG. 1M, a metal electrode may be disposed along a side of each ITO electrode pattern for providing an improved conductivity, and the entire surface may be further coated with an optional organic or inorganic insulating film and an organic or inorganic alignment control film, which may be imparted with a uniaxial orientation axis as by rubbing or oblique vapor deposition.

The thus-treated electrode plate structure may be fixed to a similar electrode plate structure but with no color filter layer with an appropriate spacer therebetween and the periphery thereof is sealed with an epoxy adhesive, etc. to form a cell structure, into which a liquid crystal is injected through an injection port. Then, the injection port is sealed to form a liquid crystal cell (color display device). The electrode plate structure according to the present invention may be used for any type of liquid crystals inclusive of a conventional TN-liquid crystal, basically, but most suitably be used for a ferroelectric liquid crystal.

Hereinbelow, the present invention will be more specifically described based on Examples.

EXAMPLE 1

An electrode plate structure was prepared through the steps as described with reference to FIGS. 1A–1M.

Referring to the figures, a glass substrate 1 was provided with color filter patterns of R(4), G(5) and B(6) each in a thickness of about 1.5 micron (FIG. 1E) through repetition of ordinary lithographic steps including application of a colored photosensitive polyamide resin ("PA-1012R", "PA-1012G" and "PA-1012B", available from Ube Kosan K. K.) dissolved in N-methyl-2-pyrrolidone at a viscosity of 90 to 130 cP by spinner coating (FIG. 1A), pattern exposure to ultraviolet rays from an ultra high-voltage mercury lamp to form a photocured part 2a (FIG. 1B and 1C), and development with a cyclohexane-based developer solution (FIG. 1D). Then, the color filter layer including the color filter patterns 4–6 was further coated with a solution of a photosensitive polyamide resin ("PA-1000C", available from Ube Kosan K. K.), followed by drying, ultraviolet exposure and post-curing at 200° C. to form an about 2 micron-thick protective layer 7.

Then, the above-treated substrate having a color filter pattern thereon was subjected to sputtering of ITO at a substrate temperature of 250° C. at a deposition pressure of $3 \times 10^{-3}$ Torr under Ar stream of 200 sccm and $O_2$ stream of 2 sccm to form an about 1,000 Å-thick ITO film 8. Then, the substrate having the ITO film 8 was placed in a clean oven, heated to 250° C. in 2 hours, held at that temperature for 1 hour and cooled gradually in 4 hours (FIG. 1G).

Then, the ITO film on the substrate was coated with a 1 micron-thick photoresist film 9 (FIG. 1H), which has then exposed through a prescribed electrode pattern mask (FIG. 1I) and developed with a prescribed developer (FIG. 1J). Then, the substrate having the thus-developed photoresist pattern 9 was dipped in a hydroiodic acid solution with a concentration of about 56 wt. % at 40° C. for 2 minutes under a light-shielding condition (FIG. 1K), and then the photoresist pattern 9 was peeled off to form an ITO electrode pattern (FIG. 1L and 1M).

The thus formed ITO electrode pattern 9 (FIG. 1M) was free from thinning or irregularity of the pattern due to the etching to retain an accurate shape, and occurrence of short circuit between adjacent electrodes were extremely rare.

Further, as a result of the use of hydroiodic acid as the etchant, the color filter pattern comprising the cured photosensitive polyamide was not damaged at all.

EXAMPLE 2

An electrode plate structure was prepared in the same manner as in Example 1 except that the etching of the ITO film was performed for 2.5 minutes by using a 70/30-volume mixture of about 56 wt. %-hydroiodic acid solution/35 wt. %-ferric chloride at 40° C. as the etchant.

The thus prepared electrode plate structure has an ITO electrode pattern which was free from thinning or irregularity of the pattern due to the etching to retain an accurate shape, and occurrence of short-circuit between adjacent electrodes were extremely rare.

Further, as a result of the use of a hydroiodic acid-ferric chloride aqueous solution mixture as the etchant, the color filter pattern comprising the cured photosensitive polyamide was not damaged at all.

COMPARATIVE EXAMPLE

An electrode plate structure was prepared in the same manner as in Example 1 except that the etching of the ITO film was performed for 4 minutes by using a mixture of 60 vol. % of hydrochloric acid and 40 vol. % of ferric chloride aqueous solution ($Fe_2Cl_3$ 35 wt. %) at 47° C.

The thus-prepared electrode plate structure had an ITO electrode pattern which was accompanied with remarkable thinning of the pattern due to side etching, thus failing to provide a prescribed electrode width.

Further, as a result of the use of the hydrochloric acid-ferric chloride aqueous solution mixture, the color filter pattern comprising the cured photosensitive polyamide was accompanied with partial peeling or lifting along with a damage of the protective film, so that the resultant electrode plate structure was practically unacceptable at all.

What is claimed is:

1. A process for producing an electrode plate structure for a liquid crystal color display, comprising the steps of:

forming on a substrate a color filter layer comprising a photosensitive polyamide resin containing a colorant dispersed therein, coating the color filter layer with a protective layer comprising a photosensitive polyamide resin, coating the protective layer with an ITO (indium-tin-oxide) film, heat-treating the ITO film, and selectively etching the ITO film patternwise with an etchant comprising hydroiodic acid or a hydroiodic acid-ferric chloride aqueous solution mixture to leave an ITO electrode pattern.

2. A process according to claim 1, wherein the coating with the ITO film is performed at an elevated temperature of at most 270° C.

3. A process according to claim 1, wherein the heat-treatment of the ITO film after the coating is performed by gradual heating to a temperature in the range of 200°–300° C., holding at the temperature for a prescribed time and gradual cooling from the temperature.

* * * * *

UNITED STATES PATENT AND TRADEMARK OFFICE
CERTIFICATE OF CORRECTION

PATENT NO. : 5,185,059
DATED : February 9, 1993
INVENTOR(S) : NAOYA NISHIDA, ET AL.

It is certified that error appears in the above-identified patent and that said Letters Patent is hereby corrected as shown below:

COLUMN 3

Line 8, "$R_2$:                                        CHX=CY—CONH—," should read --$R_2$: CHX=CY—CONH—,--.
Line 30, "also" should read --also be--.
Line 58, "e.g., 200°-300°C.," should read --e.g., 100-200°C./hour, holding at a temperature of 200-300°C.,--.

COLUMN 5

Line 14, "has" should read --was--.
Line 37, "wt. %-hydroiodic" should read --wt. % hydroiodic--.
Line 38, "wt. %-ferric chloride" should read --wt. % ferric chloride--.

Signed and Sealed this

First Day of February, 1994

Attest:

BRUCE LEHMAN

Attesting Officer      Commissioner of Patents and Trademarks